| (12) | United States Patent | (10) Patent No.: | US 11,747,883 B2 |
|---|---|---|---|
| | Wakasa et al. | (45) Date of Patent: | Sep. 5, 2023 |

(54) SEMICONDUCTOR DEVICE

(71) Applicant: RENESAS ELECTRONICS CORPORATION, Tokyo (JP)

(72) Inventors: Daisuke Wakasa, Tokyo (JP); Kazuaki Gemma, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/547,876

(22) Filed: Dec. 10, 2021

(65) Prior Publication Data

US 2022/0206555 A1 Jun. 30, 2022

(30) Foreign Application Priority Data

Dec. 28, 2020 (JP) ................... 2020-218398

(51) Int. Cl.
  *G06F 1/324* (2019.01)
  *G06F 1/10* (2006.01)
  *H03K 5/15* (2006.01)
  *G06F 1/12* (2006.01)

(52) U.S. Cl.
  CPC ............... *G06F 1/324* (2013.01); *G06F 1/10* (2013.01); *H03K 5/15* (2013.01)

(58) Field of Classification Search
  CPC .............. G06F 1/324; G06F 1/10; H03K 5/15
  See application file for complete search history.

(56) References Cited

U.S. PATENT DOCUMENTS

| 5,586,308 | A | * | 12/1996 | Hawkins | ................... G06F 1/06 |
| | | | | | 713/501 |
| 2015/0227185 | A1 | * | 8/2015 | Pal | ........................ G06F 1/3203 |
| | | | | | 713/320 |
| 2016/0294374 | A1 | * | 10/2016 | Gemma | ................. H03K 5/135 |
| 2017/0038791 | A1 | * | 2/2017 | Park | ........................ G06F 1/324 |
| 2021/0157381 | A1 | * | 5/2021 | Goffman-Vinopal | ........................ |
| | | | | | G06F 1/324 |

FOREIGN PATENT DOCUMENTS

JP 2013-088916 A 5/2013

* cited by examiner

*Primary Examiner* — Jaweed A Abbaszadeh
*Assistant Examiner* — Gayathri Sampath
(74) *Attorney, Agent, or Firm* — McDermott Will & Emery LLP

(57) ABSTRACT

A semiconductor device includes clock adjustment circuits, provided to a plurality of functional circuits operating in synchronization with a clock signal respectively for adjusting a delay amount for each functional circuit, and a clock path selection circuit for controlling whether a clock is transmitted to the functional circuits through any one of a plurality of paths included in the clock adjustment circuits respectively. In the semiconductor device, the clock path selection circuit outputs a path instruction signal for instructing switching of a path for transmitting a clock signal in accordance with a change in an operation state of a plurality of functional circuits.

5 Claims, 11 Drawing Sheets

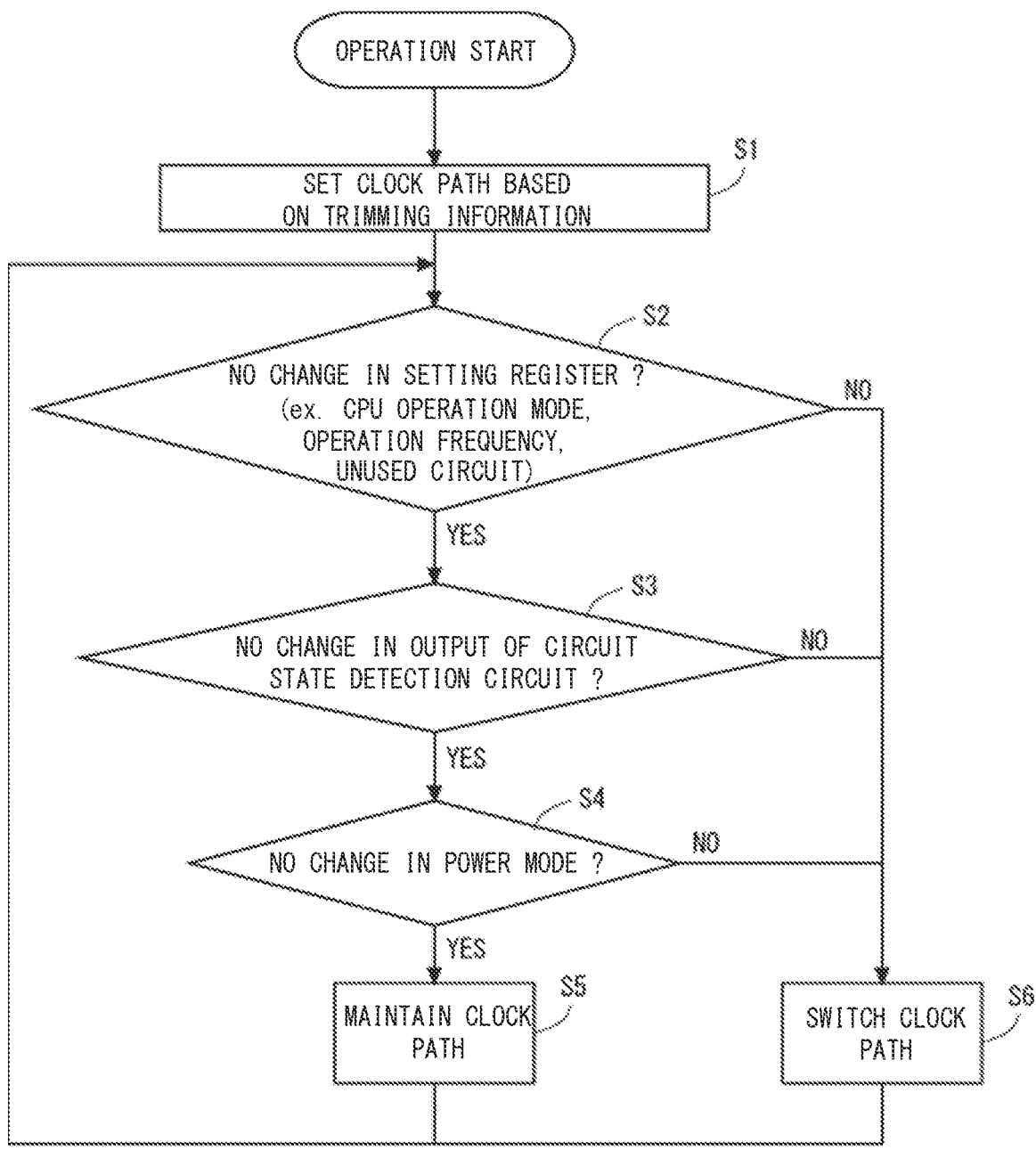

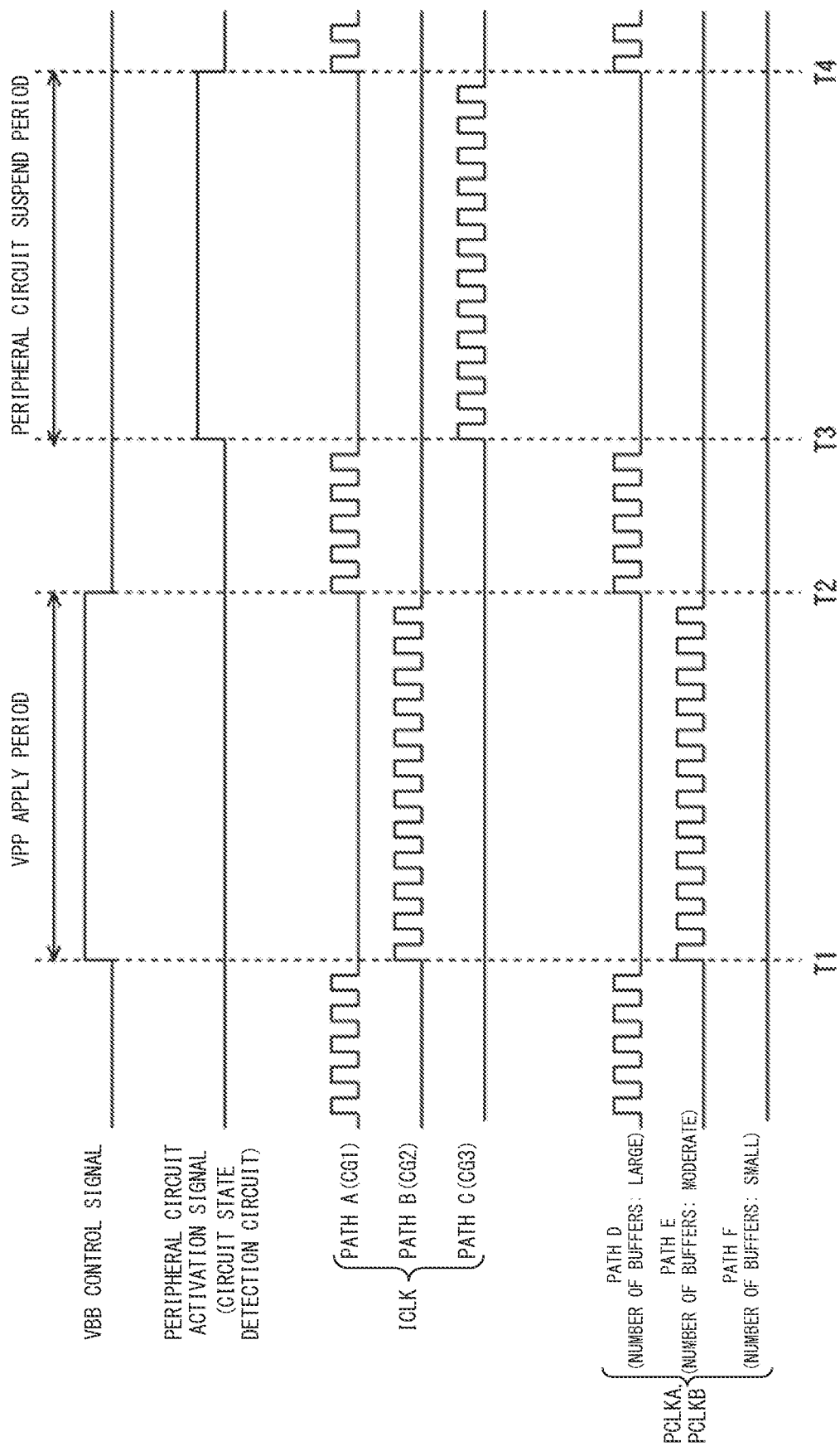

FIG. 4

| CONDITIONS OF USE | NUMBER OF BUFFERS IN ACTIVATED PATHS | | EFFECT OF POWER REDUCTION |
|---|---|---|---|
| | ICLK | PCLKA, PCLKB | |
| AVAILABLE IN EVERY CONDITION | LARGE (PATH A) | LARGE (PATH D) | SMALL |
| APPLYING BACK BIAS | MODERATE (PATH B) | MODERATE (PATH E) | MEDIUM |
| OPERATING IN ROOM TEMPERATURE | | | |
| OPERATING WITH typ. VOLTAGE | | | |
| OPERATING AT LOW SPEED | | | |
| NOT USING PERIPHERAL CIRCUIT | SMALL (PATH C) | NOT USED | LARGE |
| NOT USING SYSTEM CIRCUIT (CPU, MEMORY) | NOT USED | SMALL (PATH F) | |

| | SELECT CLOCK PATH | POWER SELECTOR 41 (PATH A) | POWER SELECTOR 42 (PATH B) |
|---|---|---|---|
| NORMAL POWER MODE | PATH A (CG1) | 1 (Normal) | 0 (VBB) |
| | PATH B (CG2) | 0 (VBB) | 1 (Normal) |
| VBB POWER MODE | PATH A (CG1) | 0 (VBB) | 0 (VBB) |
| | PATH B (CG2) | 0 (VBB) | 0 (VBB) |

POWER CONSUMPTION OF CTS BUFFER WHEN PATH A IS SELECTED

IN NORMAL MODE
VBB POWER IS NOT USED
(COMPARATIVE EXAMPLE)

IN NORMAL MODE
APPLY VBB POWER
TO PATH B

IN VBB MODE

POWER CONSUMPTION OF CTS BUFFER WHEN PATH B IS SELECTED

SEMICONDUCTOR DEVICE

CROSS-REFERENCE TO RELATED APPLICATION

The disclosure of Japanese Patent Application No. 2020-218398 filed on Dec. 28, 2020, including the specification, drawings and abstract hereby incorporated by reference in its entirety.

BACKGROUND

The present invention relates to a semiconductor device, for example, a semiconductor device including a plurality of circuits operating in synchronization with a clock.

In recent years, in semiconductor devices including logic circuits represented by processors, an increase in power consumption has become a problem. An example of a technique for reducing power consumption in this logic circuit is disclosed in Patent Document 1.

The semiconductor device described in Patent Document 1 includes a clock generating circuit having a low-frequency mode and a high-frequency mode as its operation modes for generating a clock having a higher frequency than the low-frequency mode in the high-frequency mode, a non-volatile memory operated based on a clock generated by the clock generation circuit, a central processing unit for obtaining read data read from the non-volatile memory via the clock generation circuit, a clock delay unit provided in a supply path of the clock from the clock generation circuit to the central processing unit. The clock delay unit includes a second path bypassing the first path and a plurality of stages of buffers cascaded. At the time of the high-frequency mode the clock delay unit supplies the clock from the clock generation circuit to the central processing unit via the first path. In the low-frequency mode, the clock delay unit supplies a clock from the clock generation circuit to the central processing unit via a second path. [Patent Document 1] Japanese Unexamined Patent Application Publication No. 2013-88916

SUMMARY

In the technique described in Patent Document 1, the central processing unit can be operated in a low-frequency mode and a high-frequency mode, the power consumed in the buffer during the low-frequency mode is reduced by supplying a clock to the central processing unit via a second path that bypasses the plurality of stage buffers during the low-frequency mode. However, in the technique described in Patent Document 1, there is a problem that it is impossible to reduce the power consumption in each of the various circuit states including a high-frequency mode (or high-speed operation mode).

Other problems and novel features will become apparent from the description herein and from the accompanying drawings.

According to an embodiment, a semiconductor device includes a clock adjustment circuit for adjusting a delay amount for each functional circuit, the clock adjustment circuit being provided to each of a plurality of functional circuits operating in synchronization with a clock signal, and a clock path selection circuit for controlling whether to transmit a clock to the functional circuit through any one of a plurality of paths included in each of the clock adjustment circuit. The clock path selection circuit outputs a path selection signal for instructing the switching of the path for transmitting the clock signal in response to a change in an operating state of the plurality of functional circuits.

According to the embodiments, the semiconductor device can reduce power consumption corresponding to changes in the state of circuit.

BRIEF DESCRIPTIONS OF THE DRAWINGS

FIG. 2 is a flowchart for explaining a clock path switching operation in the semiconductor device according to the first embodiment.

FIG. 3 is a timing chart for explaining an example of a clock path switching operation in the semiconductor device according to the first embodiment.

FIG. 4 is a table for explaining a choice of clock paths that can be selected in the semiconductor device according to the first embodiment.

DETAILED DESCRIPTION

Figure 1:
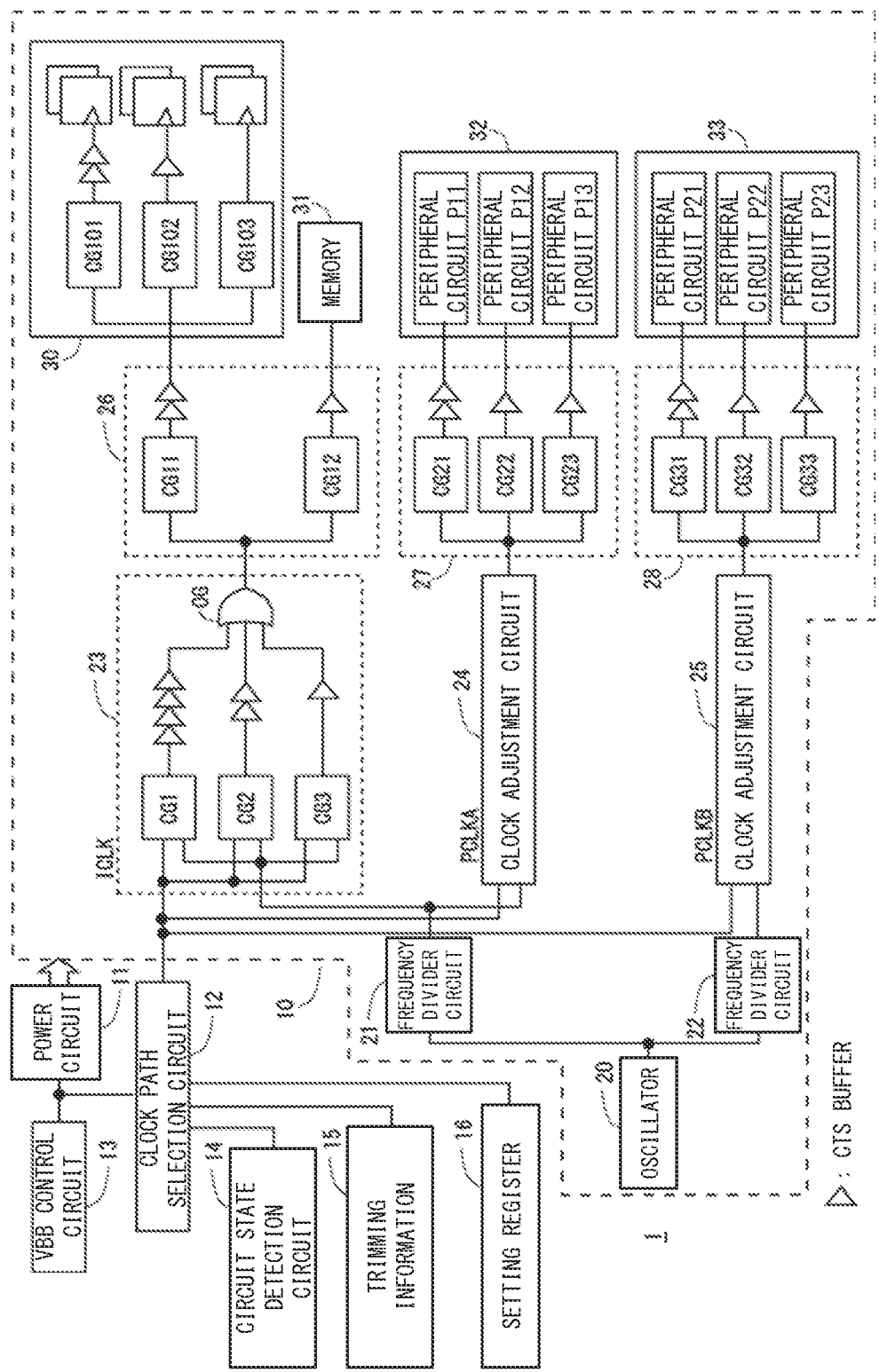
FIG. 1 is a block diagram of a semiconductor device according to a first embodiment.

For clarity of explanation, the following description and drawings are appropriately omitted and simplified. In addition, each element described in the drawings as a functional block for performing various processes can be configured by a CPU, a memory, and other circuits in terms of hardware, and is realized by a program loaded into the memory in terms of software. Therefore, it is understood by those skilled in the art that these functional blocks can be realized in various forms by hardware alone, software alone, or a combination thereof, and the present invention is not limited to any of them. In the drawings, the same elements are denoted by the same reference numerals, and a repetitive description thereof is omitted as necessary.

Also, the program described above may be stored using various types of non-transient computer readable media (non-transitory computer readable medium) and supplied to a computer.

Non-transitory computer-readable media include various types of tangible storage medium. Examples of non-transient computer-readable media include magnetic recording media (e.g., flexible disks, magnetic tapes, hard disk drives), magnetic-optical recording media (e.g., magnetic-optical disks), CD-ROM (read only memory), CD-R, CD-R/W, and solid-state memories (e.g., mask ROMs, PROM (programmable ROM), EPROMs (erasable PROM), flash ROMs, RAMs (random access memory)). The programs may also be supplied to a computer by various types of transitory computer-readable transitory computer readable medium. Examples of temporary computer readable media include electrical signals, optical signals, and electromagnetic waves. The transitory computer readable medium may provide the program to the computer via wired communication paths such as electrical wires and optical fibers or wireless communication paths.

First Embodiment

First, a block diagram of a semiconductor device 1 according to a first embodiment is shown in FIG. 1. The semiconductor device 1 according to the first embodiment shown in FIG. 1 includes a logic circuit 10. The logic circuit 10 is for performing information processing performed by the semiconductor device 1, to realize main functions of the semiconductor device 1. In addition, in the semiconductor device 1 according to the first embodiment, with respect to the logic circuit 10, a power supply circuit 11, a clock path selection circuit 12, aa power control circuit (e.g., VBB control circuit 13), a circuit state detection circuit 14, a trimming information 15, and a setting register 16 are provided.

The power supply circuit 11 is for supplying power to the logic circuit 10. The power supply circuit 11 outputs, for example, a first power supply voltage that is a main power supply voltage for operating the semiconductor device (normal power supply voltage), and a second power supply voltage to reduce the leakage current caused in the transistor (VBB power supply voltage). It is assumed that the VBB power supply voltage is selectively output during the operation of the logic circuit 10 based on an instruction from the VBB control circuit 13. This VBB supply voltage is a voltage applied to the back gate of the transistor. There is a feature that the leakage current is reduced as a threshold voltage of the transistor is changed by applying a positive or negative voltage that is different from the ground voltage to the well portion. As a transistor suitable for leakage current control by such VBB power supply voltage, there is a transistor of SOTB (silicon on thin buried oxide) structure using the SOI (silicon on insulator) technique.

The clock path selection circuit 12 outputs a path selection signal for instructing a path for transmitting a clock signal in the first clock adjustment circuit and the second clock adjustment circuit in the logic circuit 10 in response to a change in the operating state of the first circuit and the second circuit. Here, in the clock path selection circuit 12, based on the information obtained from the VBB control circuit 13, the circuit state detection circuit 14, the trimming information 15, and the setting register 16, the power consumption is reduced in the transmission path of the clock in dynamic and real time.

The VBB control circuit 13 instructs whether to supply a normal power supply voltage to the power supply circuit or supply a VBB power supply voltage. The circuit state detection circuit 14 senses a circuit state that includes at least a chip temperature for logic circuit 10. For example, the circuit state detection circuit 14 detects the chip temperature, detects a circuit that is determined to be free from a problem by stopping the function or decreasing the operation speed based on the degree of contribution to the processing performed on the entire chip among the enabled circuits, and the like. The trimming information 15 is for trimming to reduce the manufacturing variation of the circuit elements constituting the logic circuit 10 in the manufacturing process of the semiconductor device 1 and is intended to retain information relating to the trimming. In the setting register 16, information about a circuit to be operated effectively and a circuit for disabling the operation among the functional circuits included in the logic circuit 10, and the operating conditions of the circuits (e.g., CPU operation mode, operation frequency) are stored.

The clock path selection circuit 12 instructs, based on at least one information of information obtained from the VBB control circuit 13, the circuit state detection circuit 14, the trimming information 15, and the setting register 16, a delay amount given to the clock signal by the clock adjustment circuit in the logic circuit 10, or the change in the number of stages of a delay amount adjustment buffer (hereinafter, CTS buffer, or simply referred to as a buffer) by the path selection signal to the clock adjustment circuit.

Here, an example of the logic circuit 10 to be a target of transmitted path control of the clock signal by the clock path selection circuit 12 will be described with reference to FIG. 1. Incidentally, the clock path selection circuit 12 has a plurality of circuit groups with which the logic circuit 10 needs to synchronize the clock timing, and a logic circuit having a clock adjustment circuit forgiving a different delay amount for each clock signal to be transmitted to each circuit group as a control target. Therefore, the block diagram of the logic circuit 10 shown in FIG. 1 is an example and does not cover other circuit configurations.

As shown in FIG. 1, the logic circuit 10 includes an oscillator 20, frequency divider circuits 21 and 22, clock adjustment circuits 23 to 25, clock fine adjustment circuits 26 to 28, CPU 30, a memory 31, peripheral circuit groups 32 and 33. Incidentally, one of the clock adjustment circuits 23 to 25 is a first clock adjustment circuit, the other one becomes a second clock adjustment circuit. One of the circuit group of the CPU 30 and the memory 31, the peripheral circuit group 32, and the peripheral circuit group 33 corresponds to a first circuit, and the other corresponds to a second circuit.

The oscillator 20 outputs a clock signal. The divider circuit 21, 22 adjusts the frequency of the clock signal each oscillator 20 generates in accordance with the operating frequency of the circuit of the subsequent stage. The frequency dividing circuit 21 is not necessarily required.

The clock adjustment circuit 23 to 25, the basic configuration of the delay amount to be set in the path included is different but is the same clock adjustment circuit 23 will be described as an example clock adjustment circuit. The clock adjustment circuit 23 has a clock gate CG1 to CG3, a plurality of CTS buffers, and OR gate OG. Enable (state of passing the clock signal) and disable (state of shutting off the clock signal) of the block gate CG1 to CG3 is switched based on the path selection signal given from the clock path selection circuit 12.

Then, in the clock adjustment circuit 23, CTS buffers connected in multi-stage respectively subsequent to the clock gate CG1 to CG3 are provided. This CTS buffer includes one path for each corresponding clock gate. In the example shown in FIG. 1, three transmission paths of clock signals having different delay amounts given to the clock signal are configured in the clock adjustment circuit 23. One of the three clock signal transmission paths corresponds to the first path and the other corresponds to the second path. Incidentally, the clock adjustment circuit 24 and the clock adjustment circuit 25 also has three paths with different delay amounts given to the clock signal. One of the three paths formed in the clock adjustment circuit 24 and the clock adjustment circuit 25 corresponds to a third path, and the other corresponds to a fourth path. The output of the OR gate OG of the clock adjustment circuit 23 to the clock adjustment circuit 25 has a delay amount of each path that is adjusted so that the timing of the clock edge is aligned.

Further, in the clock adjustment circuit 23, the CTS buffers of the multi-stage provided in the subsequent stage of the clock gate CG1 are set to be the largest number of stages and thus delay is the largest. The number of stages of the CTS buffers provided in the subsequent stage of the clock gate CG3 is the smallest and the delay is the smallest. In addition, the number of stages of the multi-stage CTS buffers provided in the subsequent stage of the clock-gate CG2 is set to the number of intermediate stages of the other paths, and the delay amounts also become intermediate sizes of the other paths. Further, it is assumed that the power consumption of each path increases as the number of stages of the CTS buffer increases.

Clock fine adjustment circuits 26 to 28 correspond to the first circuit group (e.g., CPU 30 and memory 31), a second circuit group (e.g., peripheral circuit group 32), the third circuit group (e.g., peripheral circuit group 33), respectively. Then, the clock fine adjustment circuits 26 to 28 adjust the edge timing between the clock signals supplied to the circuits included in the corresponding circuit group.

The CPU 30, the memory 31, and the peripheral circuit groups 32 and 33 are functional circuits. It is assumed that one of the CPU 30 and memory 31, the peripheral circuit group 32, and the peripheral circuit group 33 corresponds to a first circuit, and the other corresponds to a second circuit. Further, the CPU 30 operates on the basis of a clock signal provided through a fifth path formed in the clock fine adjustment circuit 26. The CPU 30 realizes various functions by executing programming. The CPU 30 may use peripheral circuits included in the peripheral circuit groups 32 and 33 in the process. The memory 31 operates based on a clock signal provided via a sixth path formed in the clock fine adjustment circuit 26. The memory 31 stores data such as a program executed by the CPU 30, intermediate information generated during the processing of the CPU 30, and a processing result of the CPU 30.

The peripheral circuit group 32 includes peripheral circuits P11 to P13. Further, the peripheral circuit group 33 includes peripheral circuits P21 to P23. The peripheral circuits P11 to P13, P21 to P23 are, for example, a coprocessor, an AD conversion circuit, a PWM signal generating circuit, a circuit such as a timer. In addition, it is assumed that the clock fine adjustment circuits 27 and 28 are provided with clock transmission paths corresponding to the peripheral circuits P11 to P13 and P21 to P23.

In the semiconductor device 1 according to the first embodiment, the clock path selection circuit 12 switches the transmission path of the clock signal in the clock adjustment circuits 23 to 25 dynamically and automatically based on the information obtained from VBB control circuit 13, the circuit state detection circuit 14, the trimming information 15, and the setting register 16, and that is one of the features. Therefore, the operation of the clock path selection circuit 12 and the logic circuit 10 will be described in detail below.

First, a flowchart for explaining a clock path switching operation in the semiconductor device 1 according to the first embodiment is shown in FIG. 2. The flowchart shown in FIG. 2 shows mainly the processing of the clock path selection circuit 12.

As shown in FIG. 2, when the semiconductor device 1 starts its operation, the clock path selection circuit 12 first reads the trimming information 15 and sets a clock path based on the trimming information 15 in step S1.

Next, the clock path selection circuit 12 checks whether or not the information stored in the setting register 16 has changed, and when there has been a change, switches the path based on the information stored in the setting register 16 in steps S2 and S6. Here, when the semiconductor device 1 is activated, the clock path switching process of step S6 is performed regardless of whether or not the information of the setting register 16 is changed. Further, in step S2, when there is no change from the previous confirmation in the information stored in the setting register 16, the process of step S3 is performed.

In step S3, the clock path selection circuit 12 performs, with reference to the output of the circuit state detection circuit 14, when there is a change in the output value, switching of the clock path according to the output of the circuit state detection circuit 14 after the change (steps S3, S6). Here, when the semiconductor device 1 is activated, regardless of the presence or absence of a change in the output of the circuit state detecting circuit 14 performs the switching process of the clock path of step S6. Further, in the step S3, when there is no change from the previous confirmation in the output of the circuit state detecting circuit 14, the process of step S4 is performed.

In step S4, with reference to the output of the VBB control circuit 13, it is determined whether there is a change in the power supply mode. When there is a change in the power supply mode in the determination of step S4, the clock path selection circuit 12 performs switching of the clock path in accordance with the change. Here, when the semiconductor device 1 is activated, regardless of the presence or absence of a change in the output of the VBB control circuit 13, switching processing of the clock path of step S6 is performed in response to the output of the VBB control circuit 13 at the activation. Further, in step S4, it repeats the processing after step S2 by maintaining the clock path when there is no change from the previous confirmation to the output of the VBB control circuit 13 (step S5).

Next, an example of the operation of the semiconductor device 1 operating in accordance with the flowchart illustrated in FIG. 2 will be described. There, it shows a timing chart for explaining an example of a clock path switching operation in the semiconductor device according to the first embodiment in FIG. 3. The example shown in FIG. 3 shows an operation including a period in which the normal power supply mode is switched to the VBB power supply mode and the peripheral circuits P11 to P13 included in the peripheral circuit group 32 are not used. In the operation of FIG. 3, the clock fine adjustment circuit 26, the clock fine adjustment circuit 28 and the peripheral circuit group 33 was removed from consideration.

Further, in FIG. 3, the path A to the path C are illustrated as paths included in the clock adjustment circuit 23. The path A is a path corresponding to the control gate CG1, and is a path that consumes a large number of CTS buffers and a large amount of power. The path B is a path corresponding to the control gate CG2, and is a path in which the number of CTS buffers is moderate and the consumed power is moderate. Path C is a path corresponding to the control gate CG3, the number of CTS buffers is small path consumes power. And, route D to route F are shown as a route included in the clock adjustment circuit 24. The path D is a path in which the number of CTS buffers is the largest and power consumption is large. Path E is a path in which the number of CTS buffers is moderate and the power consumption is also moderate. The path F is a path in which the number of CTS buffers is small and the power consumption is small.

In the example shown in FIG. 3, in the normal power supply mode, and, when utilizing any of the circuits of the peripheral circuit group 32, the path A of the clock adjustment circuit 23 and the path D of the clock adjustment circuit 24 are used. This is because the operation speed is the fastest, and the timing difference between the clock timing of CPU 30 and the clock timing of the memory 31 and the clock timing of the peripheral circuits 33 is the most severe.

In the example shown in FIG. 3, the VBB control signal is switched from the low level to the high level at the timing T1. Thus, in the semiconductor device 1, the VBB power supply voltage is supplied to the logic circuit 10. This VBB power supply voltage is supplied to the low power consumption mode, and the frequency of the clock is also low. Therefore, the restrictions on the timing differences between CPU 30 and the clocks of the memories 31 and the peripheral circuits 33 become looser than in the normal power supply mode. Therefore, the clock path selection circuit 12 enables the path B to the clock adjustment circuit 23, and provides a path selection signal to enable the path E to the clock adjustment circuit 24. Thus, in the semiconductor device 1, the power consumption associated with the CTS buffer for the number of CTS buffers included in the clock path is reduced. This state continues until the timing T2 at which the VBB control signal returns to the low level.

Further, in the example shown in FIG. 3, the peripheral circuit activation signal of the output signal of the circuit state detecting circuit 14 in the period of the timing T3 to T4 becomes a high level, a state in which the peripheral circuit group 32 is suspended. During the suspend of the peripheral circuit group 32, there is no need to ensure the consistency of the clock timings between the peripheral circuit group 32 and CPU 30 and the memory 31. This is because the clock adjustment circuit 24 serving as a clock transfer path to the peripheral circuit group 32 is in a state of shutting off the clock. Therefore, the clock path selection circuit 12 outputs a path selection signal for selecting the path C with respect to the clock adjustment circuit 23. As a result, the clock adjustment circuit 23 supplies clock signals to CPU 30 and the memory 31 via the path C. In the period from the timing T3 to the timing T4, since the path that effectively operates is only the path C, the power consumption associated with the CTS buffer is greatly reduced as compared with the other periods.

Subsequently, a description will be given of the relationship between the operation mode of the clock transmission path and the circuit used in the semiconductor device 1 according to the first embodiment. Therefore, FIG. 4 is a table for explaining choices of clock paths that can be selected in the semiconductor device according to the first embodiment. Incidentally, the operation mode shown in FIG. 4 is a part of the operation mode used in the semiconductor device 1, and it is necessary to note that there are other operation modes. Note that the power reduction effect of FIG. 4 is a reduction effect based on the power consumption in the circuit without using the clock path selection circuit 12 of the semiconductor device 1.

As shown in FIG. 4, the path A and path D where the edge timing between the clock signals is adjusted most accurately are available in all modes of operation. In this case, the power reduction effect is small.

Then, in the semiconductor device 1, when a back bias is applied to supply the VBB power supply voltage to the logic circuit 10, during normal temperature operation in which the chip temperature is near the design reference center, during typ. voltage operation in which normal power supply voltage is given, during low-speed operation the clock frequency is suppressed low, it is possible to utilize the path B and path E. In this case, the electric power reduction effect is at a moderate level.

In addition, in the semiconductor device 1, when the peripheral circuit group is not used, the path C for supplying clocks to only the CPU 30 which is a system-related circuit and the memory 31 can be validated. Further, in the semiconductor device 1, it is possible to a state of enabling only the path F when operating only the peripheral circuit group by not using the system circuit. At this time, the power reduction effect in the semiconductor device 1 is greatest.

As described above, in the semiconductor device 1 according to the first embodiment, the clock path selection circuit 12 switches the clock transmission paths provided in the clock adjustment circuits 23 to 25 on the basis of the trimming information 15 with relatively little change, the information obtained from the setting register 16, and the information of the real-time change in the circuit state obtained from the VBB control circuit 13 and the circuit state detection circuit 14. Then, in the semiconductor device 1 according to the first embodiment, a plurality of paths in which the number of stages of the CTS buffer is different is provided in the clock adjustment circuits 23 to 25. Thus, in the semiconductor device 1 according to the first embodiment, the change in the circuit state is reflected dynamically and automatically to avoid the circuit failure at that time and to set a path in which power consumption the lowest. That is, according to the semiconductor device 1 according to the first embodiment, it is possible to significantly improve the reduction effect of power consumption that dynamically and automatically reflects the change in the circuit state.

Embodiment 2

In a second embodiment, a semiconductor device 2 will be described as a modification of the semiconductor device 1 according to the first embodiment. In the description of the second embodiment, the same reference numerals are assigned to components equivalent to those of the first embodiment, and description thereof is omitted.

Figure 5:
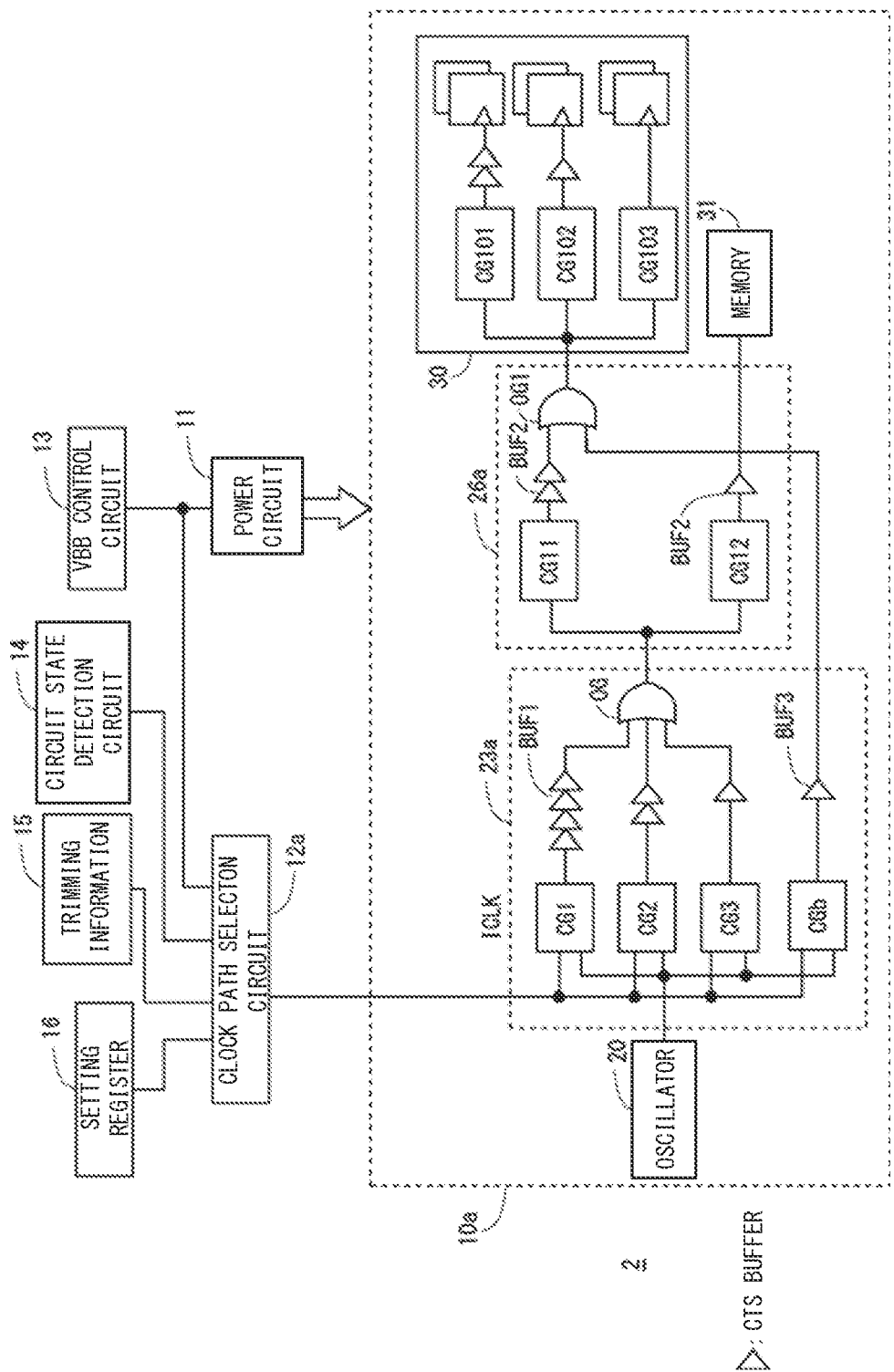
FIG. 5 is a block diagram of a semiconductor device according to a second embodiment.

FIG. 5 shows a block diagram of the semiconductor device 2 according to the second embodiment. In FIG. 5, the clock adjustment circuits 24, 25, the clock fine adjustment circuits 27, 28, the blocks corresponding to the peripheral circuit group 32, 33 are not shown.

As shown in FIG. 5, in the semiconductor device 2 according to the second embodiment, the logic circuit 10a is provided in place of the logic circuit 10. The logic circuit 10a includes a clock adjustment circuit 23a and the clock fine adjustment circuit 26a in place of the clock adjustment circuit 23 and the clock fine adjustment circuit 26. Further, the semiconductor device 2 has a clock path selection circuit 12a in place of the clock path selection circuit 12.

In the semiconductor device 2 according to the second embodiment, there is provided with a bypass path for transmitting the clock signal to the clock transfer path in the logic circuit 10 to the circuit of interest with a small number of CTS buffers.

More specifically, when the first circuit group including the CPU 30 and the memory 31 is regarded as a first circuit group, the CPU 30 corresponds to a third circuit group, and the memory 31 corresponds to a fourth circuit group. In the semiconductor device 2, a fifth path corresponding to the CPU 30 (for example, a path formed by the clock gate CG11 and the two-stage CTS buffer) is provided at the subsequent stage of the clock adjustment circuit 23, and a sixth path corresponding to the memory 31 (for example, a path formed by the clock gate CG12 and the one-stage CTS buffer) is provided at the subsequent stage of the clock adjustment circuit 23. The clock path selector 12a has a bypass path for bypassing the fifth path and the sixth path to transmit clock signals to the CPU 30. The bypass path includes a clock gate CGb provided in the clock conditioning circuit 23a, a buffer BUF3, an OR gate CG1 provided in the clock fine conditioning circuit 26a. The OR gate OG1 arbitrates a clock signal transmitted to the CPU 30 through the clock gate CG11 and a clock signal transmitted to CPU 30 through the buffer BUF3.

Further, the clock path selection circuit 12a is obtained by adding a function of switching the enable and disable of the clock gate CGb to the clock path selection circuit 12.

In the following explanation, the code BUF1 is used for the CTS buffer group provided at the subsequent stage of the clock gate CG1, and the code BUF2 is used for the CTS buffer group provided at the subsequent stage of the clock gate CG11, CG12.

Figure 6:
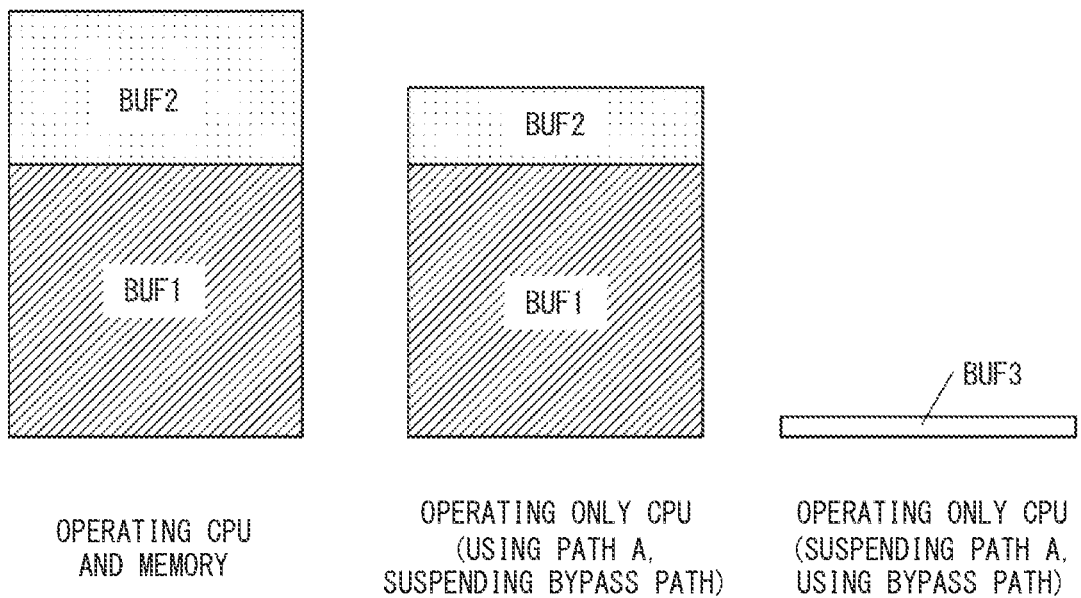
FIG. 6 is a diagram for explaining power consumption in the semiconductor device according to the second embodiment.

Here, the power consumption reduction effect of the semiconductor device 2 according to the second embodiment will be described. FIG. 6 shows a diagram for explaining power consumption in the semiconductor device according to the second embodiment.

As shown in FIG. 6, when operating both the CPU 30 and the memory 31 in the semiconductor device 2, since all of the clock gate CG1 and the clock gate CG11, CG12 are enabled, the power associated with the CTS buffer group BUF1 and CTS buffer group BUF2 is generated together. When only the CPU 30 is enabled without using the bypassing path, the clock gate CG12 may be disabled, so that only the power consumed in relation to the CTS-buffer group BUF2 is reduced. In the semiconductor device 2 according to the second embodiment, when the bypass path is used when only the CPU 30 is used, the clock signal can be supplied to the CPU 30 even when all of the path A using the control gate CG1, the fifth path using the control gate CG11, and the sixth path using the control gate CG12 are stopped. Therefore, as shown in FIG. 6, the power consumption associated with the CTS buffer can only be the power consumption associated with the CTS buffer BUF3 associated with the bypass path.

Figure 7:
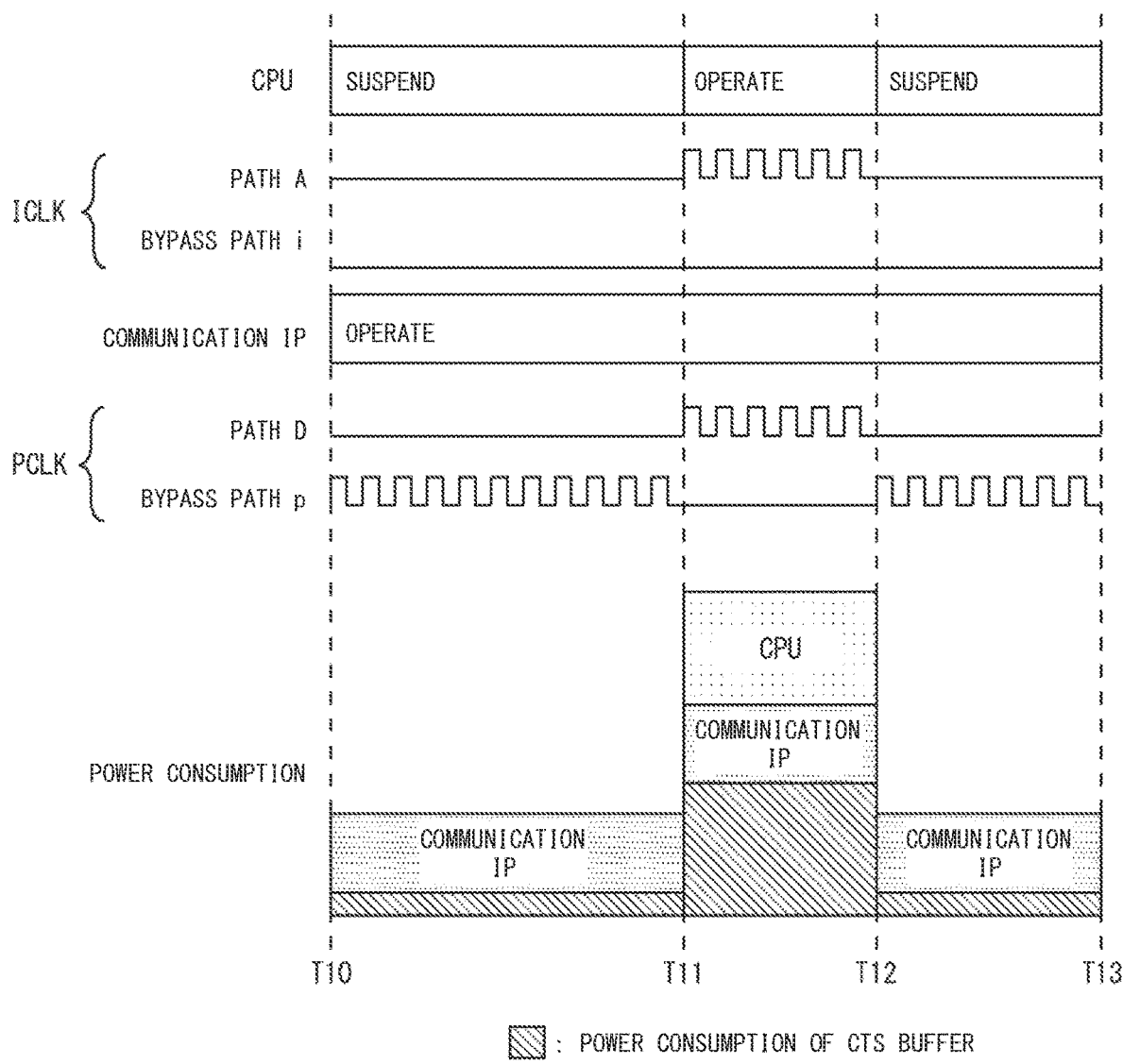
FIG. 7 is a timing chart for explaining an example of a transition of an operation and power consumption of the semiconductor device according to the second embodiment.

An actual operation of this reduction effect will be described as an example. FIG. 7 shows a timing chart for explaining an example of the transition of the operation and power consumption of the semiconductor device according to the second embodiment. The timing chart shown in FIG. 7 is an example in which communication IP is provided as peripheral circuits, and processing is performed by the CPU 30 every time a predetermined amount of data to be processed is accumulated by communication by the communication IP.

In the example shown in FIG. 7, since the process is performed by the CPU 30 in the period from the timing T11 to the timing T12, the power consumed by the CTS buffers in this period is increased. On the other hand, a period other than the timing T11 to T12 (e.g., a period and a period of the timing T12 to T13 of the timing T10 to T11) transmits a clock signal to the communication IP using a bypass path p provided in the clock adjustment circuit 24 and the clock fine adjustment circuit 27, for example. Thus, in the semiconductor device 2 according to the second embodiment, it is possible to significantly reduce the power consumption associated with the CTS buffer in this period.

Figure 8:
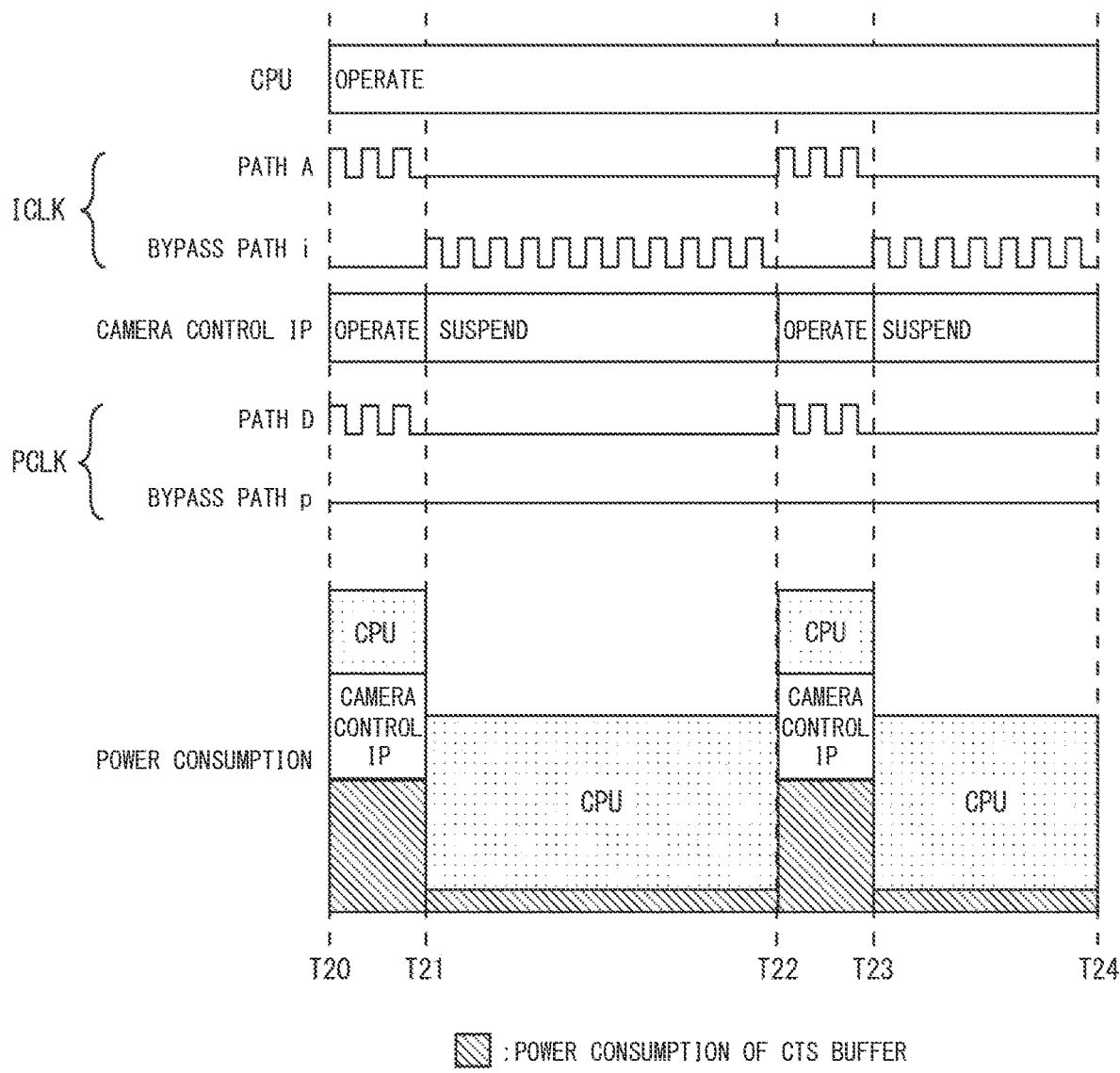
FIG. 8 is a timing chart for explaining another example of the transition of the operation and power consumption of the semiconductor device according to the second embodiment.

Another example is shown in FIG. 8. FIG. 8 is a timing chart illustrating another example of the transition of the operation and power consumption of the semiconductor device according to the second embodiment. In the embodiment shown in FIG. 8, a camera control IP is provided as peripheral circuits, and images captured by the camera control IP are processed by the CPU 30. Further, in the embodiment shown in FIG. 8, since the captured images are transmitted to the CPU 30 during the camera control IP operation, the camera control IP and the CPU 30 operate simultaneously only during the camera control IP operation.

In the example shown in FIG. 8, the camera control IP and the CPU 30 operate simultaneously during timings T20 to T21 and timings T22 to T23. Therefore, this period, the path D of the path A and the clock adjustment circuit 24 of the clock adjustment circuit 23 is activated power consumption associated with the CTS buffer is increased. On the other hand, during the periods of the timings T21 to T22 and T23 to T24 in which only the CPU 30 needs to be operated, the clock signals are supplied to the CPU 30 by using the bypass path i provided in the clock adjustment circuit 23 and the clock fine adjustment circuit 26. Thus, the power consumption associated with the CTS buffer is greatly reduced during this period.

From the above descriptions, in the semiconductor device 2 according to the second embodiment, it is possible to significantly reduce the power consumption associated with the CTS buffer when there is a circuit state that does not require the restriction of clock timing with other circuits by providing a bypass path than the first embodiment. The switching of the clock signal can be performed dynamically and automatically by using the clock path selection circuit 12a.

Embodiment 3

In a third embodiment, a semiconductor device 3 will be described as another embodiment of the semiconductor device according to the first and second embodiments. In the description of the third embodiment, the same reference numerals are assigned to components equivalent to those of the first embodiment, and descriptions thereof will be omitted.

Figure 9:
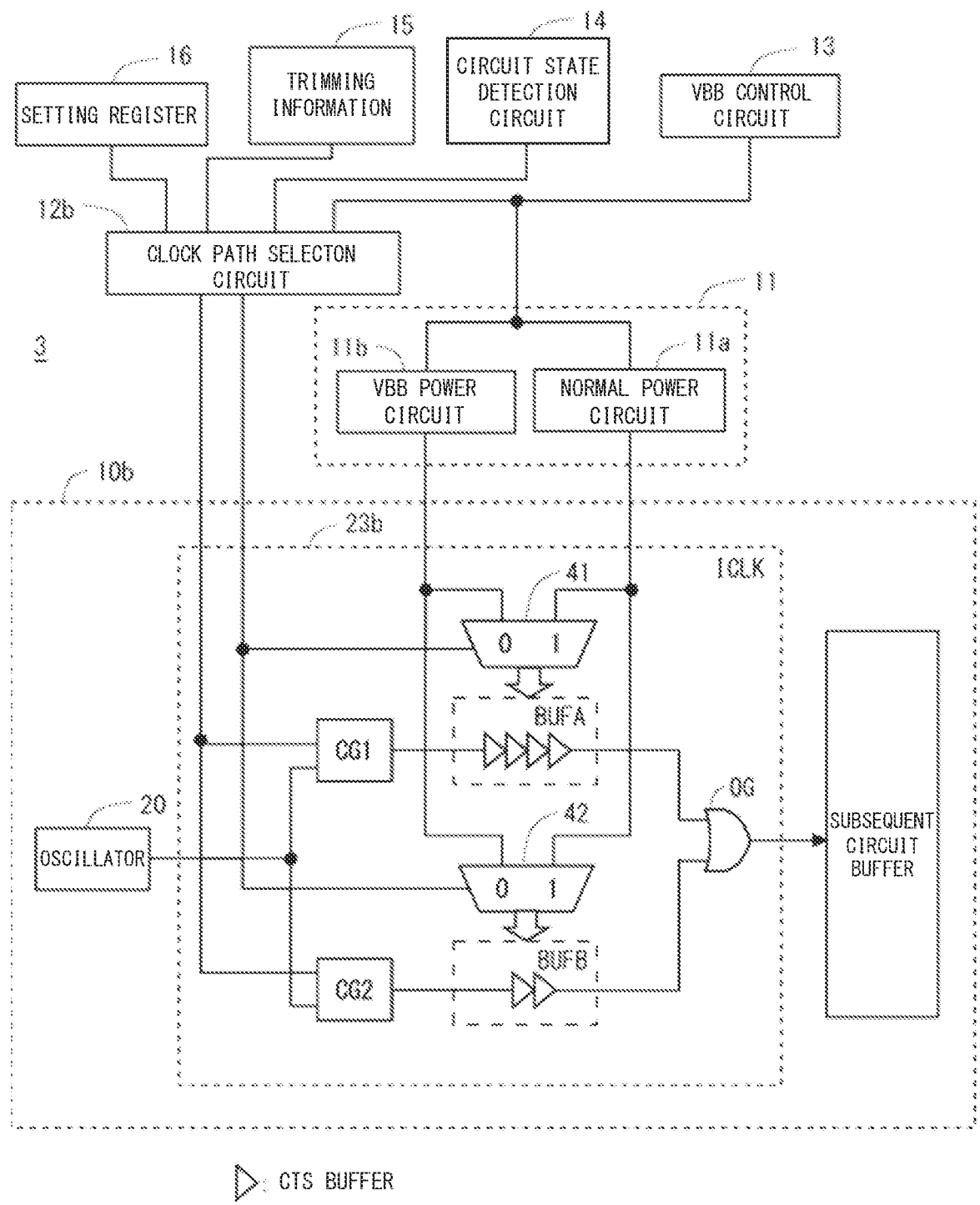
FIG. 9 is a block diagram of a semiconductor device according to a third embodiment.

FIG. 9 shows a block diagram of a semiconductor device 3 according to the third embodiment. In the semiconductor device 3 according to the third embodiment, since it has a feature in the supply method to the CTS buffer of the VBB power supply voltage, in FIG. 9, shows only the related portions, it is not shown for other circuit blocks. As shown in FIG. 9, the semiconductor device 3 according to the third embodiment includes a logic circuit 10b instead of the logic circuit 10. Then, the logic circuit 10b has a clock adjustment circuit 23b in place of the clock adjustment circuit 23. The clock adjustment circuit 23b is obtained by adding the power selection circuit 41 and 42 to the clock adjustment circuit 23. Incidentally, the power selection circuit is intended to be provided for each path, and in FIG. 9, because it shows only two paths of the path A and path B, the number of the power selection circuits is two.

Further, FIG. 9 shows a normal power supply circuit 11a and VBB power supply circuit 11b inside the power supply circuit 11. Normal power supply circuit 11a generates the first power supply voltage (e.g., normal power supply voltage) and supplies the same to the logic circuit 10b. The VBB power supply circuit 11b generates a second power supply voltage (e.g., VBB power supply voltage) and supplies the same to the logic circuit 10b. The normal power supply voltage corresponds to the main power supply voltage that operates the semiconductor device. The VBB power supply voltage corresponds to a power supply voltage that reduces leakage current occurring in the transistor. Which of these power sources is to be generated is instructed by the VBB control circuit 13.

Then, the semiconductor device 3 provides a CTS buffer BUFA provided corresponding to the control gate CG1 by selecting one of the normal power supply voltage and the VBB power supply voltage by the power supply selection circuit 41. Further, by the power selection circuit 42 selects one of the normal power supply voltage and the VBB power supply voltage and supplies the same to the CTS buffer BUFB provided corresponding to the control gate CG2.

Further, the semiconductor device 3 has a clock path selection circuit 12b in place of the clock path selection circuit 12. The clock path selection circuit 12b has a function of controlling the power selection circuit 41, 42 so as to supply the VBB power supply voltage to the CTS buffer of the path that is not selected. Further, the clock path selection circuit 12b switches the power to be supplied to the CTS buffer also by the operation mode set in the semiconductor device 3.

Figures 10, 11:
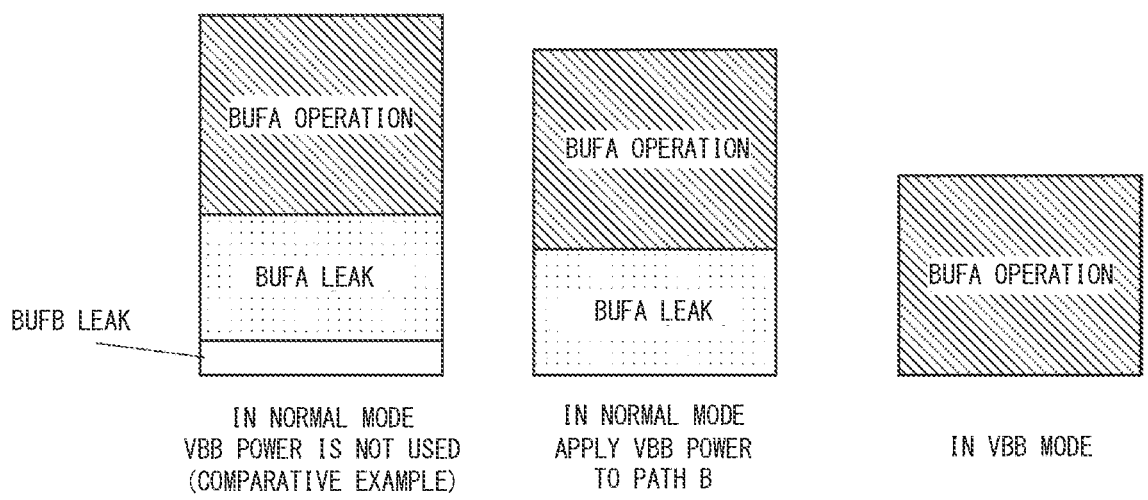
FIG. 10 is a table for explaining an operation mode of the semiconductor device according to the third embodiment.
FIG. 11 is a diagram illustrating power consumption when selecting a path A in the semiconductor device according to the third embodiment.

Therefore, the difference between the power supply voltage and the operation mode clock path selection circuit 12b instructs selection. FIG. 10 shows a table for explaining the operation mode of the semiconductor device according to the third embodiment. Incidentally, in the table shown in FIG. 10, only the information about the path B corresponding to the path A and the control gate CG2 corresponding to the control gate CG1 is shown as a typical example.

As shown in FIG. 10, the semiconductor device 3 has two operation modes: a normal power supply mode in which the normal power supply voltage is mainly supplied to the logic circuit 10b; and a VBB power supply mode in which only the VBB power supply voltage is supplied to the logic circuit 10b. Then, in the clock path selection circuit 12b, in the normal power supply mode, the normal power supply voltage is supplied to the path instructing the activation, and the path instructing the disable controls the power selection circuit 41, 42 so as to supply the VBB power voltage. Further, in the clock path selection circuit 12b, in the VBB power supply mode, and the power selection circuits 41 and 42 are controlled so that VBB power is supplied to the CTS buffer at all times.

Here, the power consumption of the CTS buffer in the semiconductor device 3 according to the third embodiment will be described. Here, FIG. 11 shows a diagram illustrating the power consumption when selecting the path A in the semiconductor device according to the third embodiment. As shown in FIG. 11, while the path A corresponding to the control gate CG1 is enabled, when the normal power supply voltage is given to the path B corresponding to the control gate CG2, a leakage current is generated in the CTS buffer BUFB in the path B. Also in the path A, a leakage current is generated in the CTS buffer BUFA. Therefore, when the VBB power supply voltage is supplied to the path B which is disabled, the leakage current of the CTS buffer BUFB is reduced. Furthermore, the leakage current of the CTS-buffer BUFA is reduced when the VBB power supply voltage is supplied also to the enabled path A.

Figure 12:
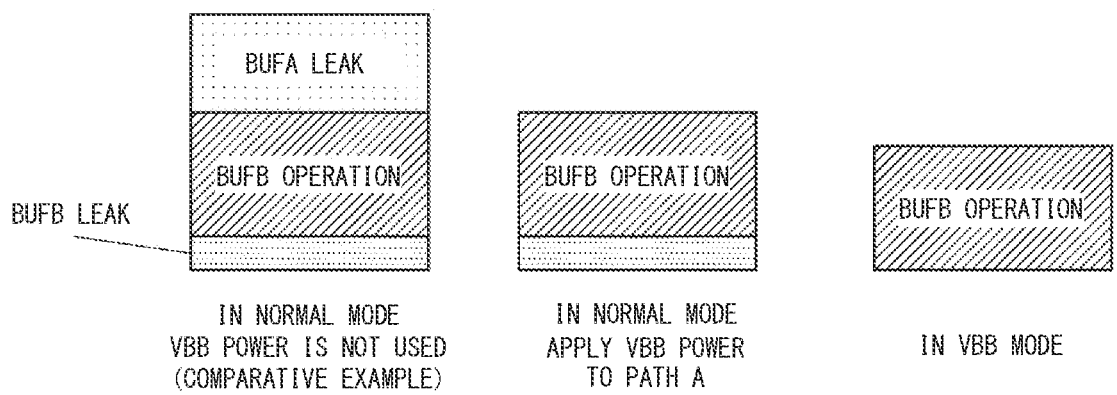
FIG. 12 is a diagram illustrating power consumption when selecting a path B in the semiconductor device according to the third embodiment.

Further, FIG. 12 shows a diagram illustrating the power consumption when selecting the path B in the semiconductor device according to the third embodiment. As shown in FIG. 12, when the path B corresponding to the control gate CG2 is enabled, when the normal power supply voltage is given to the path A corresponding to the control gate CG1, a leakage current is generated in the CTS buffer BUFA in the path A. Also in the path B, a leakage current is generated in the CTS buffer BUFB. Therefore, the leakage current of the CTS buffer BUFA is reduced when the VBB power supply voltage is supplied to the path A that is disabled. Furthermore, the leakage current of the CTS buffer BUFB is reduced when the VBB power supply voltage is also supplied to the path B which is enabled.

From the description above, in the semiconductor device 3 according to the third embodiment, it is possible to further increase the power consumption reduction effect as compared with the first and second embodiments by positively giving the VBB power supply voltage to the CTS buffer.

Although the invention made by the inventors has been specifically described based on the embodiments, the present invention is not limited to the embodiments already described, and it is needless to say that various modifications can be made within the scope of the invention.

The invention claimed is:

1. A semiconductor device comprising:
   an oscillator for outputting a clock signal;
   first and second circuits operating based on the clock signal;
   a first clock adjustment circuit provided between the oscillator and the first circuit, the first clock adjustment circuit including a first path for providing a first amount of delay to the clock signal transmitted to the first circuit, and a second path for providing a second amount of delay to the clock signal;
   a second clock adjustment circuit provided between the oscillator and the second circuit, the second clock adjustment circuit including a third path for providing a third amount of delay to the clock signal transmitted to the second circuit and a fourth path for providing a fourth amount of delay to the clock signal;
   a clock path selection circuit for outputting a path selection signal indicating a path for transmitting the clock signal in the first clock adjustment circuit and the second clock adjustment circuit in response to a change in operating conditions of the first circuit and the second circuit;
   a power supply circuit for providing a main power supply voltage for operating the semiconductor device and a power supply voltage for reducing a leakage current occurring in a transistor by switching them with respect to the first circuit and the second circuit; and
   a power control circuit for instructing to supply the main power supply voltage for operating the semiconductor device or the power supply voltage for reducing the leakage current occurring in the transistor to the power supply circuit,
   wherein the clock path selection circuit outputs the path selection signal according to a voltage value of a power supply voltage for instructing the output which the power supply control circuit outputs to the power supply circuit,
   wherein the first to fourth paths include a power selection circuit for switching supplying the main power supply voltage for operating the semiconductor device or the power supply voltage for reducing the leakage current occurring in the transistor to a buffer circuit in the path, and
   wherein the clock path selection circuit supplies the path selection signal to the power selection circuit to provide the power supply voltage for reducing the leakage current occurring in the transistor to a path other than a transmission path of the clock signal.

2. The semiconductor device according to claim 1 further comprising a setting register in which the operating conditions of the first circuit and the second circuit is stored,
   wherein the clock path selection circuit outputs the path selection signal every time the operating conditions of the first circuit and the second circuit stored in the setting register are changed.

3. The semiconductor device according to claim 1, wherein the clock path selection circuit outputs the path selection signal based on trimming information storing a state of trimming performed in a manufacturing process with respect to the first circuit and the second circuit.

4. The semiconductor device according to claim 1 further comprising a circuit state detection circuit for detecting a circuit state including at least a chip temperature for the first circuit and the second circuit,
   wherein the clock path selection circuit outputs the path selection signal based on a detection result of a circuit state by the circuit state detection circuit.

5. The semiconductor device according to claim 1,
   wherein the first circuit includes a third circuit and a fourth circuit, and a fifth path corresponding to the third circuit in a subsequent stage of the first clock adjustment circuit, and a sixth path corresponding to the fourth circuit in a subsequent stage of the first clock adjustment circuit are included, and
   wherein the clock path selection circuit includes a bypass path for transmitting the clock signal to the third circuit by bypassing the fifth path and the sixth path.

* * * * *